US006407932B1

(12) United States Patent
Gaio et al.

(10) Patent No.: US 6,407,932 B1
(45) Date of Patent: Jun. 18, 2002

(54) ELECTROMAGNETIC INTERFERENCE SHIELD AND GROUND CAGE

(75) Inventors: David Peter Gaio; William K. Hogan; Paul John Sendelbach, all of Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/410,016

(22) Filed: Oct. 1, 1999

(51) Int. Cl.[7] .......................... H05K 9/00; H01R 13/648

(52) U.S. Cl. ..................... 361/818; 361/816; 174/35 R; 439/607; 385/92; 385/94

(58) Field of Search .............................. 385/88, 92, 93, 385/94; 439/607, 608, 609; 361/816, 818, 799, 752, 753, 212, 220; 174/35 R

(56) References Cited

U.S. PATENT DOCUMENTS 3,368,150 A * 2/1968 Worcester ................... 361/818
5,365,410 A * 11/1994 Lonka ........................ 361/816
5,414,597 A * 5/1995 Lindland .................... 361/816
5,559,676 A * 9/1996 Gessaman ................... 361/752
6,267,625 B1 * 7/2001 Gugliotti et al. ............ 439/608
6,290,535 B1 * 9/2001 Lin et al. .................... 439/607

* cited by examiner

*Primary Examiner*—Jayprakash N. Gandhi
*Assistant Examiner*—John B. Vigushin
(74) *Attorney, Agent, or Firm*—Allen, Dyer, Doppelt Mlibrath & Gilchrist, P.A.

(57) ABSTRACT

An electrical component is provided that has a plurality of electrical leads. Further, an electromagnetic interference shield and ground cage is provided which has a plurality of conductive walls connected together to form an enclosure having an open bottom. One of the walls has a plurality of openings formed therein to allow the plurality of leads to be passed into the enclosure. The electromagnetic interference shield and ground cage further has at least two ground connection pins attached to a lower edge of the walls. One of the leads is a ground lead that is electrically coupled to the electromagnetic interference shield and ground cage at one of the openings, thus reducing the length, inductance and impedance of the ground lead.

21 Claims, 3 Drawing Sheets

ELECTROMAGNETIC INTERFERENCE SHIELD AND GROUND CAGE

BACKGROUND OF THE INVENTION

1. Field of the Invention

The present invention relates to an electromagnetic interference shield and ground cage, used within fiber optic data communications transceivers for example, and, in particular, to an electromagnetic interference shield that significantly improves the electromagnetic interference (EMI) susceptibility of an optical receiver, for example, and which also serves as a low impedance ground cage for the optical transceiver.

2. Background Information

An optical transceiver is a device that uses pulses of light to carry signals and transmit and receive data at very high speeds. Typically, the light pulses are converted into, or converted from, associated electrical signals using known circuitry. Such optical transceivers are often used in devices, such as computers and data communication networks, in which data must be transmitted at high rates of speed.

Optical transceivers typically include an optical transmitter, such as a light emitting diode (LED) or laser, for example, to transmit the light pulses, and/or an optical receiver, such as a photodiode or photo detector, for example, to receive the light pulses. The optical receiver may be located adjacent to the optical transmitter to form a so-called duplex optical transceiver, such as when a so-called electro-optic receiver optical subassembly (hereinafter ROSA for short) is contained within a package, and positioned next to or adjacent to the transmitter optical subassembly (hereinafter TOSA for short). Alternatively, the optical receiver may be disposed separate from the optical transmitter.

Fiber optic transceivers typically are designed and deployed in the duplex optical transceiver configuration, comprised of both the transmitter and receiver optical devices (laser and photo detector, for example) and their associated electronics (laser driver and control, receiver preamplifier and post amplifier, and other supporting components). This allows two transceivers, separated over a distance and connected through a duplex fiber cable, to talk to one another.

Since about 1990, the fiber optic industry has been using a so-called SC duplex fiber optic connector system as the optical fiber connector interface on front of fiber optic transceivers (GBICs, SOCS, GLMs, 1X9s, etc.). The physical separation between the transmitter and receiver optical subassemblies (TOSA and ROSA) for the SC duplex connector is about 12.7 mm. However, the industry is now converting to the so-called Small Form Factor (SFF) optical connectors and associated SFF optical transceivers. For a so-called SFF LC optical connector, the separation between the TOSA and ROSA is about 6.25 mm, less than half that of the SC duplex connector. The reduced separation between the receiver and the adjacent transmitter, within a transceiver package, increases the strength of the electromagnetic coupling (or cross-talk) from the transmitter to the sensitive receiver. In terms of strength of the high speed (for instance 1 Gb/s) signal transitions, the laser driver delivers one volt signal transitions into the laser, while the adjacent sensitive receiver is delivering about 20 mV signal transitions to the post amplifier. Thus, a means of isolating or shielding the receiver from the transmitter electromagnetic radiation is needed. Strengthening or hardening the receiver against the transmitter radiation also improves its susceptibility to other EMI sources, such as emissions which radiate from within the computer system in which the transceiver modules are mounted, or from an adjacent module.

In either case, fiber-optic cables are coupled to the respective optical transmitter, and to the optical receiver, so that the light pulses can be transmitted to and from other optical transceivers, for example.

The optical transceivers are normally located on either input/output printed circuit cards, or on port cards that are connected to an input/output card (hereinafter, the card to which the optical transceiver is connected will be referred to as the host printed circuit board, or host PCB). In order to facilitate the connection of the fiber-optic cable to the optical transceiver, the transceiver is usually located on a periphery of the host printed circuit board.

Moreover, in a computer system, for example, the host printed circuit board (with the optical transceiver attached thereto) is typically connected to a further circuit board, for example, a motherboard. The assembly may then be positioned within a chassis, which is a frame fixed within a computer housing. The chassis serves to hold the assembly within the computer housing.

Typically, the optical transceiver contains its own printed circuit board (hereinafter transceiver PCB) on which the transceiver electronics (laser driver, post amplifier, etc.) are mounted, forming the interface or connection between the TOSA and ROSA (connected to the transceiver PCB) and the host PCB. The TOSA and ROSA are connected to the transceiver PCB using a number of leads, for example, when lasers or receivers are mounted in TO-cans, having a circular geometry of about 5 mm diameter. For example, the aforementioned electro-optic receiver optical subassembly (ROSA) conventionally has four leads: a power lead for supplying power to the ROSA; a single ground lead for connecting the ROSA to a ground potential; and two data leads for transmitting signals to and/or from the ROSA. Each of the four leads is typically directly connected to the transceiver printed circuit board in a known manner. For example, the ends of the respective leads may be passed into corresponding vias formed in the printed circuit board, and soldered in place. Alternatively, the four ROSA leads may be edge mounted or connected to the transceiver PCB by soldering to electrical pads on the bottom or top of the transceiver PCB. Further, each of the four leads typically has a relatively long length. The long lengths have generally been deemed necessary in order to allow the ROSA to be properly oriented relative to the transceiver PCB, while still allowing the ROSA to be properly connected thereto. This is because the leads typically extend out of a rear portion of the ROSA and initially in a direction parallel to the surface of the transceiver printed circuit board. Thus, in order to connect the leads to the transceiver printed circuit board, the leads must extend for a distance in a different direction and toward the printed circuit board. Depending on the orientation and geometry, the relatively long length of the single ground lead, for example, causes the ground lead to disadvantageously have a relatively high impedance. Also, since the ground lead is attached and connected to the TO-can body, it is more exposed to being hit by impinging EMI radiation. As is known to those skilled in the art, a high impedance on the receiver power or ground leads is undesirable, since this affects the immunity of the receiver to noise present on the power supply or ground. Therefore, there is a need to provide a way of grounding an optical receiver, for example, at a low impedance.

Furthermore, many electrical devices, when operated, generate emissions that include electromagnetic radiation.

When this electromagnetic radiation influences the proper functioning of another device, the result is known as electromagnetic interference (also known as EMI).

Various shield devices are known that can be used to reduce emitted electromagnetic radiation or protect or harden a device against emissions that impinge on it from another source (radiated electromagnetic susceptibility (RES), for example, from the adjacent transmitter or other sources of EMI radiation. The conventional shields typically cover a substantial portion of the associated electrical device, and are usually formed of a to metal that, when grounded, will attenuate or redirect the interfering electromagnetic radiation.

To prevent electromagnetic interference from having an adverse effect on the sensitive optical receiver, it is known to provide a card-mounted shield that covers the leads, for example, of the optical receiver in order to reduce the amount of electromagnetic radiation that is coupled onto the receiver leads. In a similar fashion, a shield can be attached to the transmitter optical subassembly (TOSA), surrounding its leads to reduce the amount of electromagnetic radiation that is emitted from the transmitter. These shields are typically attached and grounded to the transceiver PCB, which in turn is fastened to, and grounded in a known manner, to the host PCB and its ground.

However, the conventional optical transceiver shield, when properly positioned over a standard optical transceiver, does not prevent cross-talk (i.e., undesired coupling) between the transmitter data leads and the sensitive data leads or ground lead of the optical receiver. This is because the data leads and the ground lead are all located essentially parallel and adjacent to each other, and are all disposed inside the shield, which is also grounded. The transmitter emissions interfere with the receiver shield and ground, and then interfere with the receiver data leads by passing through the power supply of the receiver. Thus, the shield does not separate (nor shield) the data leads from the ground lead. Thus, there is a need to provide a shield that will prevent cross-talk from the transmitter to the receiver ground.

Moreover, the conventional optical receiver or transmitter shield, if not properly positioned, may inadvertently contact either the data leads or the power lead, thus causing a short circuit. Thus, there is a need for a shield that can be properly aligned relative to the leads of the transceiver, to prevent the leads from shorting out.

SUMMARY OF THE INVENTION

It is, therefore, a principle object of this invention to provide an electromagnetic interference shield and ground cage.

It is another object of the invention to provide an electromagnetic interference shield and ground cage that solves the above mentioned problems.

These and other objects of the present invention are accomplished by the electromagnetic interference shield and ground cage disclosed herein.

According to one aspect of the invention, each of the side, back and front walls of the electromagnetic interference shield and ground cage are integral with the top wall. This advantageously allows all the walls of the electromagnetic interference shield and ground cage to be simultaneously stamped or cut from a sheet of steel, for example, and then bent into the desired configuration.

In a further exemplary aspect of the invention, the abutting edges of the back wall and side walls are provided with intermeshing teeth. When the walls are properly positioned relative to each other, the intermeshing teeth of the respective walls will engage, thus advantageously reducing any gaps that might otherwise be formed between the abutting edges. As will be appreciated, gaps opening directly into the electromagnetic interference shield and ground cage may disadvantageously allow for the passage of electromagnetic interference.

In another aspect of the invention, the electromagnetic interference shield and ground cage has at least two conductive ground connection pins disposed on a lower edge of the walls. The connection pins can be easily inserted into vias formed in a printed circuit board, for connection with a ground layer by soldering, for example. Further, the connection pins may be integral with the walls to which they are connected. This advantageously allows all the connection pins to be stamped or cut from a sheet of steel, for example, simultaneous with the forming of the walls.

In another exemplary aspect of the invention, the ground lead of an electrical component projects into an opening formed in a front wall of the electromagnetic interference shield and ground cage. The ground lead does not extend past the opening any substantial distance. Instead, the ground lead is electrically coupled to the electromagnetic interference shield and ground cage by soldering, for example, the ground lead to the front wall at the opening. Any remaining portion of the ground lead that extends past the opening may then be removed. As will be appreciated, this will prevent the ground lead from being directly connected to a printed circuit board in the conventional manner. However, since the electromagnetic interference shield and ground cage is connected to a ground potential of a printed circuit board, and since the length of the ground lead is reduced to essentially zero, the impedance through the ground connection is advantageously reduced. Moreover, since the electromagnetic interference shield and ground cage has a substantially larger surface area than the original ground lead, an improved high frequency ground connection is provided, and the inductance of the ground connection is reduced, thus likewise reducing cross-talk with the other leads and other components.

In another aspect of the present invention, an insulator clip, formed from plastic, for example, is attached to the front wall. The insulator clip is provided with a relatively flat base portion, which fits flush on an outer surface of the front wall. The base portion has an opening, which is positioned over the opening in front wall. The insulator clip is further provided with two resilient protruding clips disposed on opposite sides of the opening in the base portion. The protruding clips project through the opening in the front wall, and catch on an inner surface of the front wall to hold the insulator member in position. When the power lead is inserted through the opening in the base portion, the protruding clips advantageously prevent the power lead from inadvertently coming into contact with the front wall, or in contact with the data leads. Thus, the insulator clip advantageously prevents the power lead from accidentally shorting out.

Moreover, preferably the holes in the front wall for the data leads are sized larger than the opening through the base portion. Thus, the insulator clip helps to properly align the electromagnetic interference shield and ground cage relative to the electrical component, thus minimizing the possibility that the data leads will inadvertently contact the front wall and short to ground.

Further, the base portion advantageously serves as a spacer between the front wall and the electrical component, which prevents adhesives used during the assembly of the ROSA or TOSA, for example, from mechanically interfering with attachment of the shield.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, in the application, and if used, the terms "upper", "lower", "front", "back", "over", "under", and similar such terms are not to be construed as limiting the invention to a particular orientation. Instead, these terms are used only on a relative basis.

Figure 1:
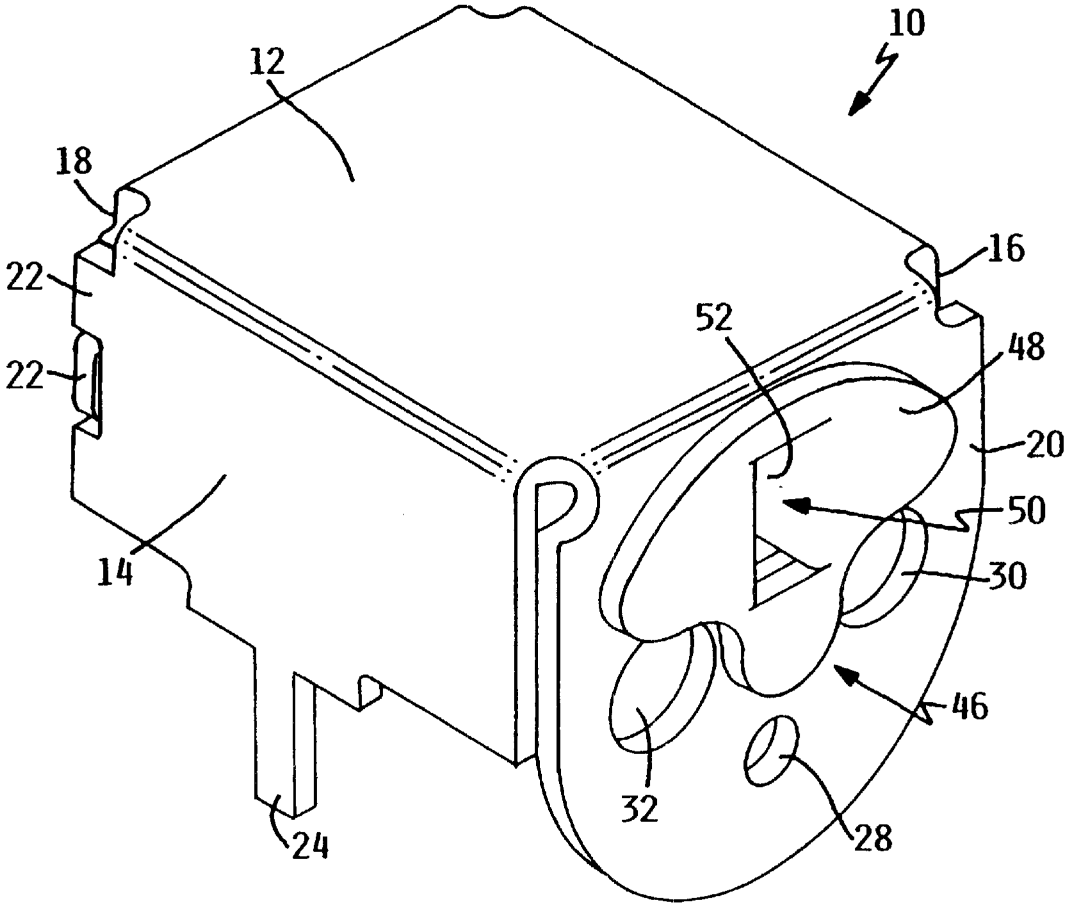
FIG. 1 is an perspective view of an exemplary embodiment of the present invention.

Referring to FIG. 1, an exemplary embodiment of an electromagnetic interference shield and ground cage 10 according to the present invention is shown. The electromagnetic interference shield and ground cage 10 is preferably formed from a conductive, non-corrosive material, such as steel having tin plating. However, the electromagnetic interference shield and ground cage 10 can be formed of any electrically-conductive material that will attenuate electromagnetic interference.

As shown, the electromagnetic interference shield and ground cage 10 has five essentially planar walls 12, 14, 16, 18 and 20. In the illustrated exemplary embodiment, the top wall 12, the two side walls 14, 16, and the back wall 18 have an essentially rectangular configuration. The front wall 20 has a semi-circular shape. However, the walls may have other shapes without departing from the spirit and scope of the present invention.

Each of the other walls 14, 16, 18 and 20 are connected to a respective edge of the top wall 12 to form an enclosure having a parallelepiped-configuration, i.e., a box-shape. However, the electromagnetic interference shield and ground cage 10 may have a different configuration without departing from the spirit and scope of the present invention. Further, the bottom of the electromagnetic interference shield and ground cage 10 is preferably left open, so as to allow the electromagnetic interference shield and ground cage 10 to be positioned over the leads of an optical transceiver, for example, in a manner which will be subsequently described.

Moreover, in the illustrated exemplary embodiment, each of the other walls 14, 16, 18 and 20 are integral with the top wall 12. This advantageously allows all the walls of the electromagnetic interference shield and ground cage 10 to be simultaneously stamped or cut from a sheet of steel, for example, and then bent into the desired configuration. Alternatively, soldering or welding can be used to fasten one or more of the walls 14, 16, 18 and 20 to the top wall 12, for example. Other methods of forming the parallelepiped-configuration of the electromagnetic interference shield and ground cage 10 are within the scope of the present invention.

Further, as shown in FIG. 1, the abutting edges of the back wall 18 and side walls 14, 16 can be provided with intermeshing teeth 22. When the walls 14, 16, 18 are properly positioned relative to each other, the intermeshing teeth 22 of the respective walls will engage, thus reducing any gaps that might otherwise be formed between the abutting edges. As will be appreciated, gaps opening directly into the electromagnetic interference shield and ground cage 10 may disadvantageously allow for the passage of electromagnetic interference.

Preferably, the electromagnetic interference shield and ground cage 10 has a conductive ground connection pin 24 disposed on a lower edge of one of the walls 14, 16, 18, 20. Moreover, preferably at least two ground connection pins 24 are provided. In the illustrated exemplary embodiment, one of the connection pins 24 is disposed on a lower edge of side wall 14, and the other connection pin 24 is disposed on a lower edge of back wall 18 (see FIG. 2). However, the connection pins 24 can be disposed in other configurations without departing from the spirit of the invention. For example, the connection pins 24 can be disposed on opposite side walls 14, 16, or two or more pins may be disposed on the edge of one of the respective walls 14, 16, 18, 20.

As shown, the connection pin 24 extends in the same plane in which the wall to which it is connected extends, and away from the top wall 12. This allows the connection pins 24 to be easily inserted into vias formed in a printed circuit board, for connection with a ground layer by soldering, for example, as will be subsequently described. Further, the connection pins 24 may be integral with the walls to which they are connected. This advantageously allows all the connection pins 24 to be stamped or cut from a sheet of steel, for example, simultaneous with the forming of the walls 12, 14, 16, 18 and 20. Alternatively, soldering or welding can be used to fasten the connection pins 24 to the respective walls 14, 16, 18 and 20, for example. Other methods of forming the connection pins 24 are within the scope of the present invention.

Figure 2:
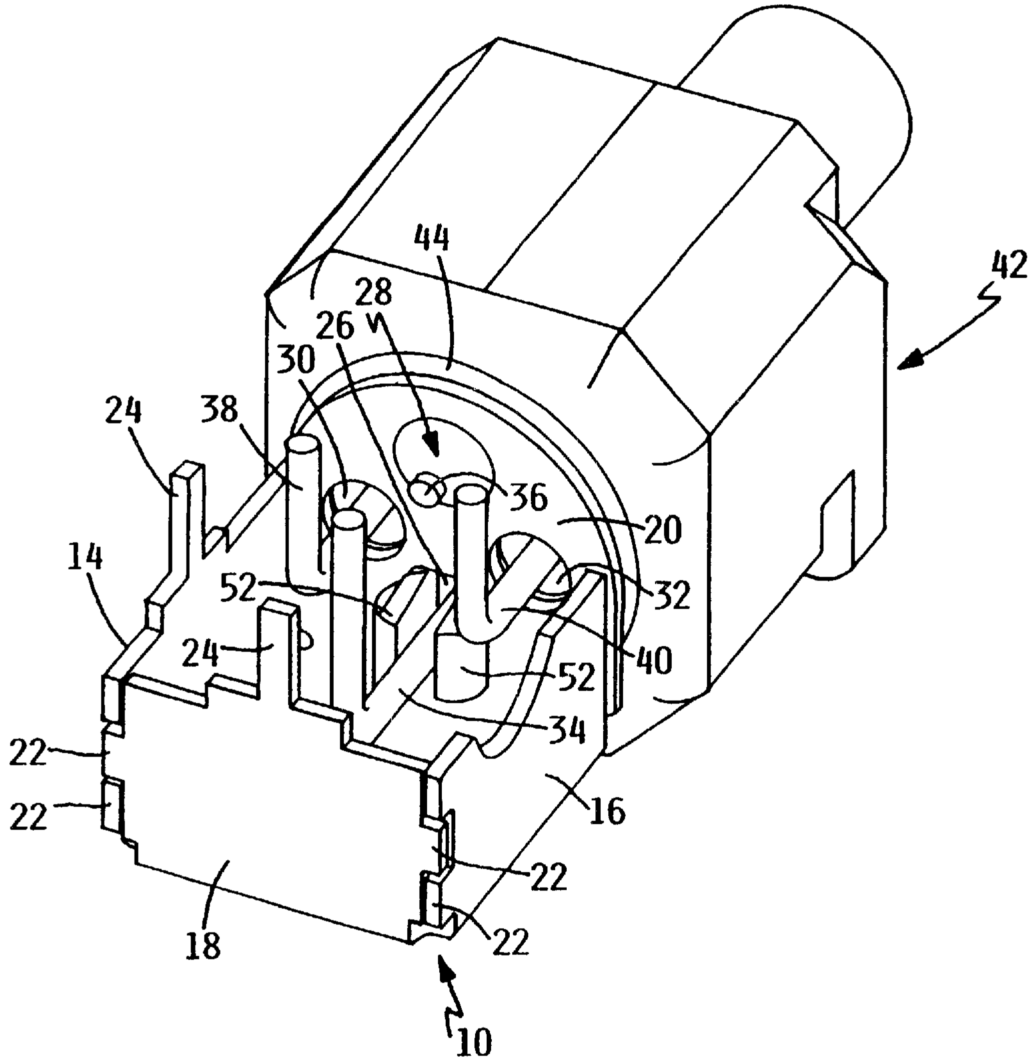
FIG. 2 is a perspective bottom view of the electromagnetic interference shield shown in FIG. 1, together with an optical receiver.

Referring also to FIG. 2, in the exemplary illustrated embodiment, the front wall 20 is provided with a plurality of openings 26, 28, 30, 32 therein. Each opening 26, 28, 30, 32 is in registration with, and allows for the passage of a respective lead 34, 36, 38, 40 of an electrical component 42 into the electromagnetic interference shield and ground cage 10. In the illustrated exemplary embodiment, the electrical component 42 is an electro-optic receiver optical subassembly (hereinafter ROSA for short), which includes a conventional so-called TO-can 44, i.e., a metal cage which houses the receiver components of the ROSA. However, the present invention may likewise be utilized with other electrical components without departing from the spirit of the invention.

Moreover, although in the illustrated exemplary embodiment the electrical component 42 has four leads, the electromagnetic interference shield and ground cage may be used with electrical components having more or fewer leads without departing from the spirit and scope of the invention.

In the illustrated exemplary embodiment, lead 34 is a power lead, and passes through opening 26; lead 36 is a ground lead, and passes into opening 28; and leads 38 and

40 are data leads, and pass through openings 30 and 32, respectively. As shown, the ground lead 36 does not extend past the opening 28 any substantial distance. Instead, the ground lead 36 is electrically coupled to the electromagnetic interference shield and ground cage 10 by soldering, for example, the ground lead to the front wall 20 at the opening 28. Any remaining portion of the ground lead 36 that extends past the opening 28 may then be removed. As will be appreciated, this will prevent the ground lead 36 from being directly connected to a printed circuit board in the conventional manner. However, the present invention provides for the electromagnetic interference shield and ground cage 10 to be connected to a ground potential of a printed circuit board, in a manner which will be subsequently described. Since the length of the ground lead 36 is reduced to essentially zero, the impedance through the ground connection is advantageously reduced. Moreover, since the electromagnetic interference shield and ground cage 10 has a substantially larger surface area than the original ground lead 36, an improved high frequency ground connection is provided, and the inductance of the ground connection is reduced, thus likewise reducing cross-talk with the other leads.

As shown in FIGS. 1 and 2, in the illustrated exemplary embodiment, an insulator clip 46, formed from plastic, for example, is attached to the front wall 20. The insulator clip 46 is provided with a relatively flat base portion 48, which fits flush on an outer surface of the front wall 20. The base portion 48 has an opening 50, which is positioned over opening 26 in front wall 20. The insulator clip 46 is further provided with two resilient protruding clips 52 (see FIG. 2), disposed on opposite sides of the opening 50. The protruding clips 52 project through the opening 26, and catch on an inner surface of the front wall 20 to hold the insulator clip 46 in position. When the power lead 34 is inserted through the opening 50, the protruding clips 52 prevent the power lead from inadvertently coming into contact with the front wall 20, or in contact with the data leads 38, 40. Thus, the insulator clip 46 advantageously prevents the power lead 34 from accidentally shorting out.

Moreover, preferably the diameter of the holes 30, 32 for the data leads 38, 40 is sized larger than a width of the opening 50 through the base portion 48. Thus, the insulator clip 46 helps to properly align the electromagnetic interference shield and ground cage 10 relative to the electrical component 42, thus minimizing the possibility that the data leads 38, 40 will inadvertently contact the front wall 20 and short to ground.

In the exemplary illustrated embodiment, the front wall 20 has a semicircular shape, which allows the front wall to be mated to the TO-can 44. Of course, other shapes of the front wall are within the scope of the present invention.

Preferably, the electromagnetic interference shield and ground cage 10 is adhered, for example soldered and/or glued, to the TO-can 44, although other ways of connecting these components together are within the scope of the present invention. For example, a conductive adhesive may be used. The base portion 48 serves as a spacer between the front wall 20 and the TO-can 44, which allows for a proper amount of adhesive to be received therebetween.

Figure 3:
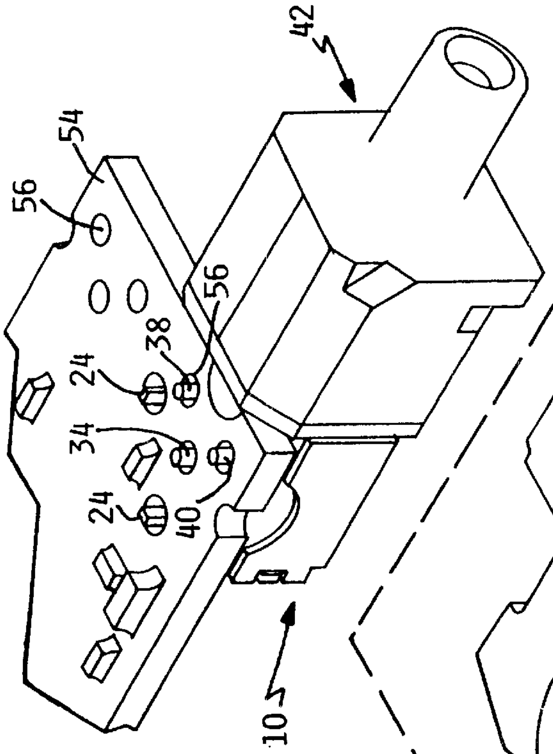
FIG. 3 is a perspective bottom view of the exemplary embodiment of the present invention shown in FIG. 1, together with an optical receiver and transceiver printed circuit board.
Figure 4:
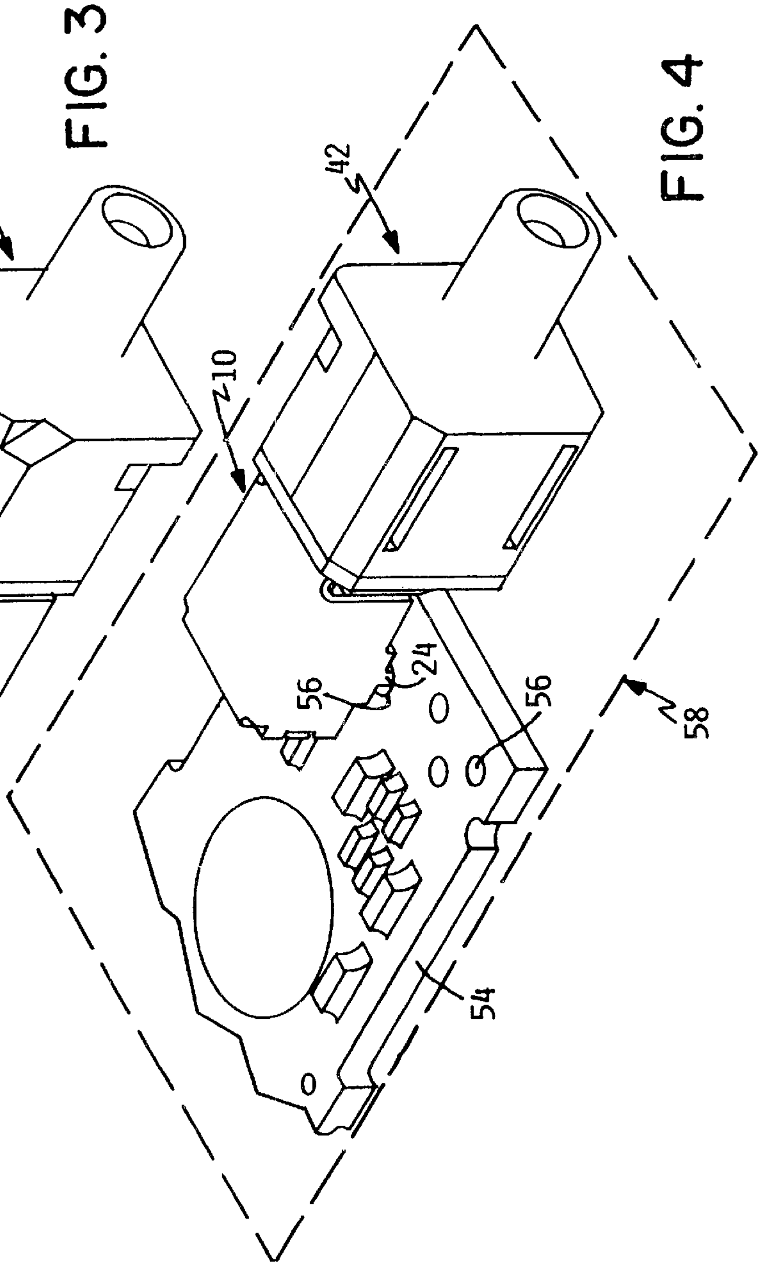
FIG. 4 is a perspective top view of the exemplary embodiment of the present invention shown in FIG. 1, together with an optical receiver and transceiver printed circuit board.

Referring to FIGS. 3 and 4, the electromagnetic interference shield and ground cage 10 and electrical component 42 are connected to a printed circuit board 54, for example a transceiver module printed circuit board. Printed circuit board 54 is provided with a plurality of vias 56, for example, for receiving the power lead 34, the data leads 38 and 40, and the ground connection pins 24, which may then be soldered in place. Alternatively, the leads and pins may be connected to the printed circuit board in other conventional manners.

Further, in the exemplary illustrated embodiment, the electromagnetic interference shield and ground cage 10 is utilized in a computer having a housing 58 in which the printed circuit board 54 is disposed (shown only schematically in FIG. 4). However, as will be appreciated, the present invention can likewise be used in other applications besides computer systems.

The illustrated exemplary embodiment was tested attached to a conventional ROSA to compare the coupled noise from an adjacent transmitter. The results indicated that the present invention improves the sensitivity of the optical receiver by about 2 dB as compared to an optical receiver tested without the present invention.

Although the above exemplary embodiments utilized a standard ROSA as an example, the electromagnetic interference shield and ground cage 10 can be modified in size and configuration in accordance with specific requirements, without departing from the spirit of the invention. Further, the present invention is not limited to use with only a ROSA, but can be used in any application where it would be desirable to reduce emissions, impedance and inductance. For example, a similar shield could be applied to the transmitter or TOSA.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. An electromagnetic interference shield and ground cage, comprising:

a plurality of conductive walls connected together to form an enclosure, with at least one of said walls having at least one opening formed therein to allow a lead to be passed into the enclosure; and an insulator clip disposed in the at least one opening, said insulator clip preventing the lead passing through the at least one opening from contacting said one wall.

2. The electromagnetic interference shield and ground cage defined in claim 1, wherein said insulator clip includes a base portion having an opening formed therein, and two protruding clips disposed on opposing edges of the opening in the base portion, said protruding clips extending through the at least one opening to attach said insulator clip to said one wall with the opening in the base portion being in registration with the at least one opening in said one wall, said protruding clips preventing the lead passing through the at least one opening from contacting said one wall.

3. The electromagnetic interference shield and ground cage defined in claim 2, wherein said one wall has a plurality of openings formed therein to allow a plurality of leads to be passed into the enclosure; and wherein the opening in the base portion is smaller than at least two of the openings formed in said one wall.

4. The electromagnetic interference shield and ground cage defined in claim 3, wherein said enclosure has an open bottom; wherein said plurality of walls includes a top wall, two side walls, a front wall and a back wall; and wherein said one wall comprises the front wall.

5. The electromagnetic interference shield and ground cage defined in claim 1, further comprising a plurality of ground connection pins, each connection pin being attached to a lower edge of a respective one of said walls.

6. An electromagnetic interference shield and ground cage, comprising:

a plurality of conductive walls, including a top wall, two side walls, a front wall and a back wall, connected together to form an enclosure having an open bottom, with said front wall having a plurality of openings formed therein to allow a plurality of leads to be passed into the enclosure;

at least two ground connection pins attached to a lower edge of said walls; and an insulator clip disposed in one of the openings.

7. The electromagnetic interference shield and ground cage defined in claim 6, wherein said plurality of conductive walls and said ground connection pins are integrally-formed together.

8. The electromagnetic interference shield and ground cage defined in claim 6, wherein said plurality of openings comprises four openings formed in the front wall.

9. The electromagnetic interference shield and ground cage defined in claim 6, wherein said insulator clip includes a base portion having an opening formed therein, and two protruding clips disposed on opposing edges of the opening in the base portion, said protruding clips extending through the one of the openings formed in the front wall to attach the insulator clip to the front wall with the opening in the base portion being in registration with the one of the openings in the front wall, said protruding clips further preventing a lead passing through the one of the openings from contacting the other leads and from contacting the front wall.

10. The electromagnetic interference shield and ground cage defined in claim 1, wherein the opening in the base portion is smaller than at least two of the openings formed in the front wall.

11. The electromagnetic interference shield and ground cage defined in claim 6, wherein said side walls abut against said back wall at respective abutting edges thereof, and wherein the abutting edges have intermeshing teeth.

12. A combination, comprising:

an electrical component having a plurality of electrical leads; and an electromagnetic interference shield and ground cage, having a plurality of conductive walls connected together to form an enclosure having an open bottom, with one of said walls having a plurality of openings formed therein to allow the plurality of leads to be passed into the enclosure; and at least two ground connection pins attached to a lower edge of said walls;

wherein one of the leads is a ground lead electrically coupled to the electromagnetic interference shield and ground cage at one of the openings; and wherein the electrical component is one of an optical receiver and optical transmitter.

13. The combination defined in claim 12, wherein another one of the leads is a power lead, and another two of the leads are data leads.

14. A combination, comprising:

an electrical component having a plurality of electrical leads;

an electromagnetic interference shield and ground cage, having a plurality of conductive walls connected together to form an enclosure having an open bottom, with one of said walls having a plurality of openings formed therein to allow the plurality of leads to be passed into the enclosure; and at least two ground connection pins attached to a lower edge of said walls; and a printed circuit board; wherein said ground connection pins and at least some of said leads are directly electrically connected to said printed circuit board.

15. The combination defined in claim 14, wherein one of the leads is a ground lead electrically coupled to the electromagnetic interference shield and ground cage at one of the openings.

16. The combination defined in claim 15, wherein another one of the leads is a power lead, and another two of the leads are data leads, said power lead and said data leads being the leads that are directly electrically connected to said printed circuit board.

17. The combination defined in claim 16, wherein said plurality of walls comprises a top wall, two side walls, a front wall and a back wall; and wherein said plurality of openings comprises four openings formed in the front wall, each of the four openings accommodating a respective one of the leads.

18. The combination defined in claim 17, further comprising an insulator clip disposed in the opening that accommodates said power lead, said insulator clip including a base portion having an opening formed therein, and two protruding clips disposed on opposing edges of the opening in the base portion, said protruding clips extending through the opening that accommodates said power lead to attach the insulator clip to the front wall with the opening in the base portion being in registration with the opening that accommodates said power lead, said protruding clips further preventing the power lead from contacting the data leads and from contacting the front wall.

19. A computer, comprising:

a housing; and a transceiver disposed in said housing, comprising:

at least one printed circuit board;

at least one of an optical receiver and optical transmitter disposed on said circuit board, said at least one of an optical receiver and optical transmitter having a plurality of electrical leads electrically coupled to said printed circuit board; and an electromagnetic interference shield and ground cage, having a plurality of conductive walls connected together to form an enclosure having an open bottom facing the printed circuit board, with one of said walls having a plurality of openings formed therein to allow at least some of the plurality of leads to be passed into the enclosure and directly connected to said printed circuit board; and at least two ground connection pins attached to a lower edge of said walls and electrically connected to a ground potential by way of said printed circuit board.

20. The computer defined in claim 19, wherein one of the leads is a ground lead electrically coupled to the electromagnetic interference shield and ground cage at one of the openings so as to connect said at least one of an optical receiver and optical transmitter to the ground potential.

21. The computer defined in claim 20, wherein another one of the leads is a power lead, and another two of the leads are data leads; wherein said plurality of walls comprises a top wall, two side walls, a front wall and a back wall; and wherein said plurality of openings comprises four openings formed in the front wall; further comprising an insulator clip disposed in an opening that accommodates said power lead, said insulator clip including a base portion having an opening formed therein, and two protruding clips disposed on opposing edges of the opening in the base portion, said protruding clips extending through the opening that accommodates said power lead to attach the insulator clip to the front wall with the opening in the base portion being in registration with the opening that accommodates said power lead, said protruding clips further preventing the respective leads passing through the respective openings from contacting each other, and from contacting the front wall.

* * * * *